United States Patent
Funahashi

(10) Patent No.: US 9,692,377 B2
(45) Date of Patent: Jun. 27, 2017

(54) DIGITAL AMPLITUDE MODULATION DEVICE AND DIGITAL AMPLITUDE MODULATION CONTROL METHOD

(71) Applicant: KABUSHIKI KAISHA TOSHIBA, Minato-ku (JP)

(72) Inventor: Yuuki Funahashi, Fuchu (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/110,548

(22) PCT Filed: Jun. 9, 2014

(86) PCT No.: PCT/JP2014/065240
§ 371 (c)(1),
(2) Date: Jul. 8, 2016

(87) PCT Pub. No.: WO2015/104859
PCT Pub. Date: Jul. 16, 2015

(65) Prior Publication Data
US 2016/0329870 A1 Nov. 10, 2016

(30) Foreign Application Priority Data

Jan. 9, 2014 (JP) .................................. 2014-002675

(51) Int. Cl.
*H03F 3/72* (2006.01)
*H04L 27/04* (2006.01)
(Continued)

(52) U.S. Cl.
CPC ............. *H03F 3/72* (2013.01); *H03F 1/0277* (2013.01); *H03F 1/52* (2013.01); *H03F 3/195* (2013.01);
(Continued)

(58) Field of Classification Search
CPC ........... H03F 1/0277; H03F 1/52; H04L 27/04
See application file for complete search history.

(56) References Cited

U.S. PATENT DOCUMENTS 5,225,902 A * 7/1993 McMullan, Jr. ........ H04H 20/42
348/E7.049
5,255,086 A * 10/1993 McMullan, Jr. ........ H04H 20/42
348/E7.049
(Continued)

FOREIGN PATENT DOCUMENTS

JP  62-8737 U  1/1987
JP  5-121976 A  5/1993
(Continued)

OTHER PUBLICATIONS

International Search Report issued Sep. 9, 2014 in PCT/JP2014/065240 Filed Jun. 9, 2014.

*Primary Examiner* — Ross Varndell
(74) *Attorney, Agent, or Firm* — Oblon, McClelland, Maier & Neustadt, L.L.P.

(57) ABSTRACT

A calculation output unit of a digital amplitude modulation device calculates and outputs a protection index of an amplifier based on a combined output signal or an amplitude modulation signal. A first protection unit outputs to a control unit a first control signal to place an entire amplifier unit in an off-controlled state, based on the protection index. A second protection unit outputs, to the control unit, a second control signal to control an upper limit number of amplifier units that can be on-controlled in parallel and a third control signal to on/off control the upper limit number or less or the initial number of the amplifiers. The control unit on/off controls the power amplifiers based on an input sound signal, the first control signal, the second control signal, and the third control signal.

28 Claims, 7 Drawing Sheets

(51) Int. Cl.
    *H03F 3/195* (2006.01)
    *H04L 27/08* (2006.01)
    *H03F 3/24* (2006.01)
    *H03F 1/52* (2006.01)
    *H03F 1/02* (2006.01)
    *H03F 3/21* (2006.01)

(52) U.S. Cl.
    CPC ............... *H03F 3/211* (2013.01); *H03F 3/24* (2013.01); *H04L 27/04* (2013.01); *H04L 27/08* (2013.01); *H03F 2200/171* (2013.01); *H03F 2200/393* (2013.01); *H03F 2200/451* (2013.01); *H03F 2203/7236* (2013.01)

(56) References Cited

U.S. PATENT DOCUMENTS

| | | | |
|---|---|---|---|
| 6,678,893 B1* | 1/2004 | Jung | H04L 25/242 348/E7.052 |
| 2005/0114879 A1* | 5/2005 | Kamieniecki | H04N 7/17318 725/15 |
| 2014/0375393 A1 | 12/2014 | Funahashi et al. | |

FOREIGN PATENT DOCUMENTS

| | | |
|---|---|---|
| JP | 11-330990 A | 11/1999 |
| JP | 2013-187843 A | 9/2013 |
| JP | 2013-191997 A | 9/2013 |
| JP | 2014-13992 A | 1/2014 |
| JP | 2014-127958 A | 7/2014 |

* cited by examiner

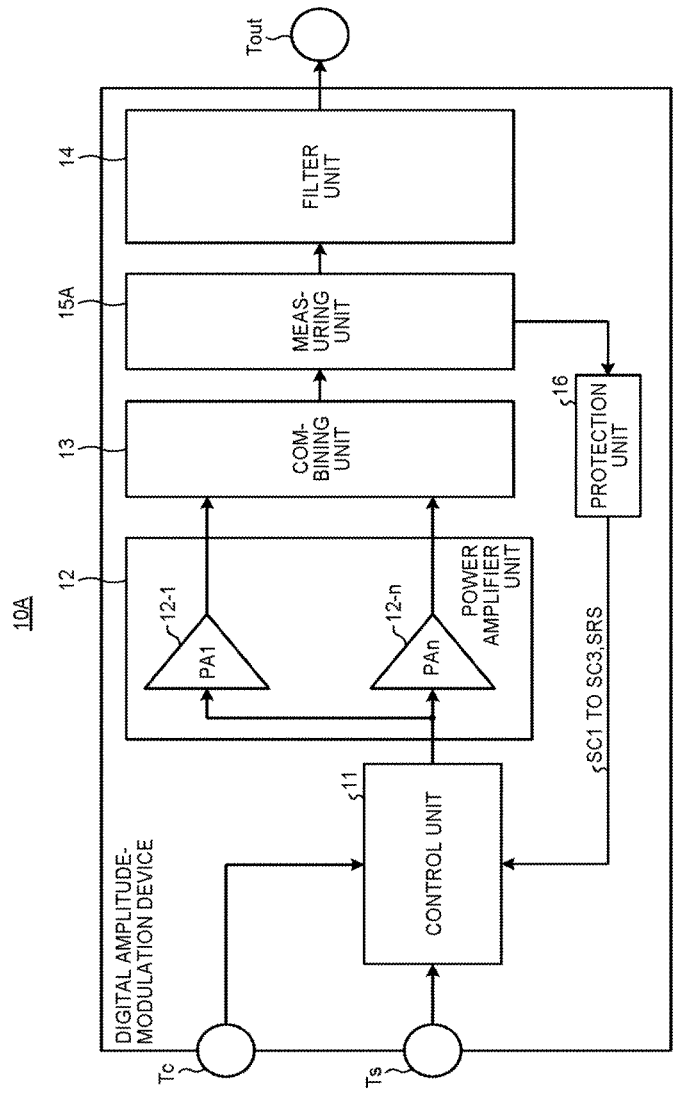

DIGITAL AMPLITUDE MODULATION DEVICE AND DIGITAL AMPLITUDE MODULATION CONTROL METHOD

CROSS-REFERENCE TO RELATED APPLICATIONS

This application is national stage application of International Application No. PCT/JP2014/065240, filed Jun. 9, 2014, which designates the United States, incorporated herein by reference, and which is based upon and claims the benefit of priority from Japanese Patent Application No. 2014-002675, filed Jan. 9, 2014, the entire contents of each of which are incorporated herein by reference.

FIELD

Embodiments described herein relate generally to a digital amplitude modulation device and a digital amplitude modulation control method.

BACKGROUND

Conventionally, a medium-wave broadcast transmitter uses a digital amplitude modulation device.

The digital amplitude modulation device includes multiple power amplifiers that are connected in parallel.

By switching control (such as controlling on/off) of the power amplifiers according to a voltage amplitude level of a modulation signal such as a sound signal provided externally, a carrier signal is amplified while the number of power amplifiers to be concurrently placed in ON state is changed.

Output signals from the power amplifiers in on the concurrent ON state are then combined to generate an amplitude modulation (AM) wave, and the generated AM wave is transmitted to a predetermined broadcast service area.

In this type of digital amplitude modulation device, the signal quality of AM waves may be deteriorated when some kind of failure, such as breakage of a power amplifier, or short circuit or disconnection of a joint portion, occurs.

Therefore, it is necessary to prevent the power amplifiers from being damaged due to, for example, a lightning strike, a load-related anomaly such as disconnection, corruption, and entry of a surge, and degradation in a standing wave ratio (SWR) by a load characteristic of an antenna.

For calculation of an SWR, a micro processing unit (MPU) is generally used. However, an MPU has a large calculation delay amount and cannot follow a sudden change in the SWR in actual time at the time of a lightning strike or the like.

This makes it difficult to prevent the power amplifiers in the digital amplitude modulation device from being damaged. Moreover, the same problem arises in a digital circuit including a complex programmable logic device (CPLD) or a field programmable gate array (FPGA) for the control to prevent a damage of power amplifiers.

Accordingly, an object of the present embodiment is to provide a digital amplitude modulation device and a digital amplitude modulation control method that can follow a sudden change along with occurrence of an anomaly in actual time.

BRIEF DESCRIPTION OF DRAWINGS

FIG. 9 is a functional configuration block diagram of a digital amplitude modulation device according to a second embodiment.

DETAILED DESCRIPTION

According to an embodiment, a digital amplitude modulation device comprises a power amplifier unit, a combining unit, a filter unit, a calculation output unit, a first protection unit, a second protection unit and a control unit. The a power amplifier unit including a plurality of power amplifiers connected in parallel to be on/off controlled based on an input sound signal, that amplify power of an input carrier signal when the power amplifiers are an on-controlled state. The combining unit combines outputs of the power amplifiers in the on-controlled state to output a combined output signal. The filter unit filters the combined output signal for output as an amplitude modulation signal in an RF band through a signal output terminal. The calculation output unit configured as an analog circuit, that outputs a calculated value based on one of the combined output signal and the amplitude modulation signal. The first protection unit configured as an analog circuit, that outputs, based on the calculated value, a first control signal to place the entire amplifier unit in an off-controlled state. The second protection unit configured as a complex circuit of an analog circuit and a digital circuit, that outputs, based on the calculated value, a second control signal to control an upper limit number of the power amplifiers that can be in the on-controlled state in parallel and a third control signal to on/off control the upper limit number or less or the initial number of the power amplifiers. The control unit performs an on/off control of the power amplifiers of the power amplifier unit based on the sound signal, the first control signal, the second control signal, and the third control signal.

Preferred embodiments will be explained below with reference to the accompanying drawings.

[1] First Embodiment

Figure 1:
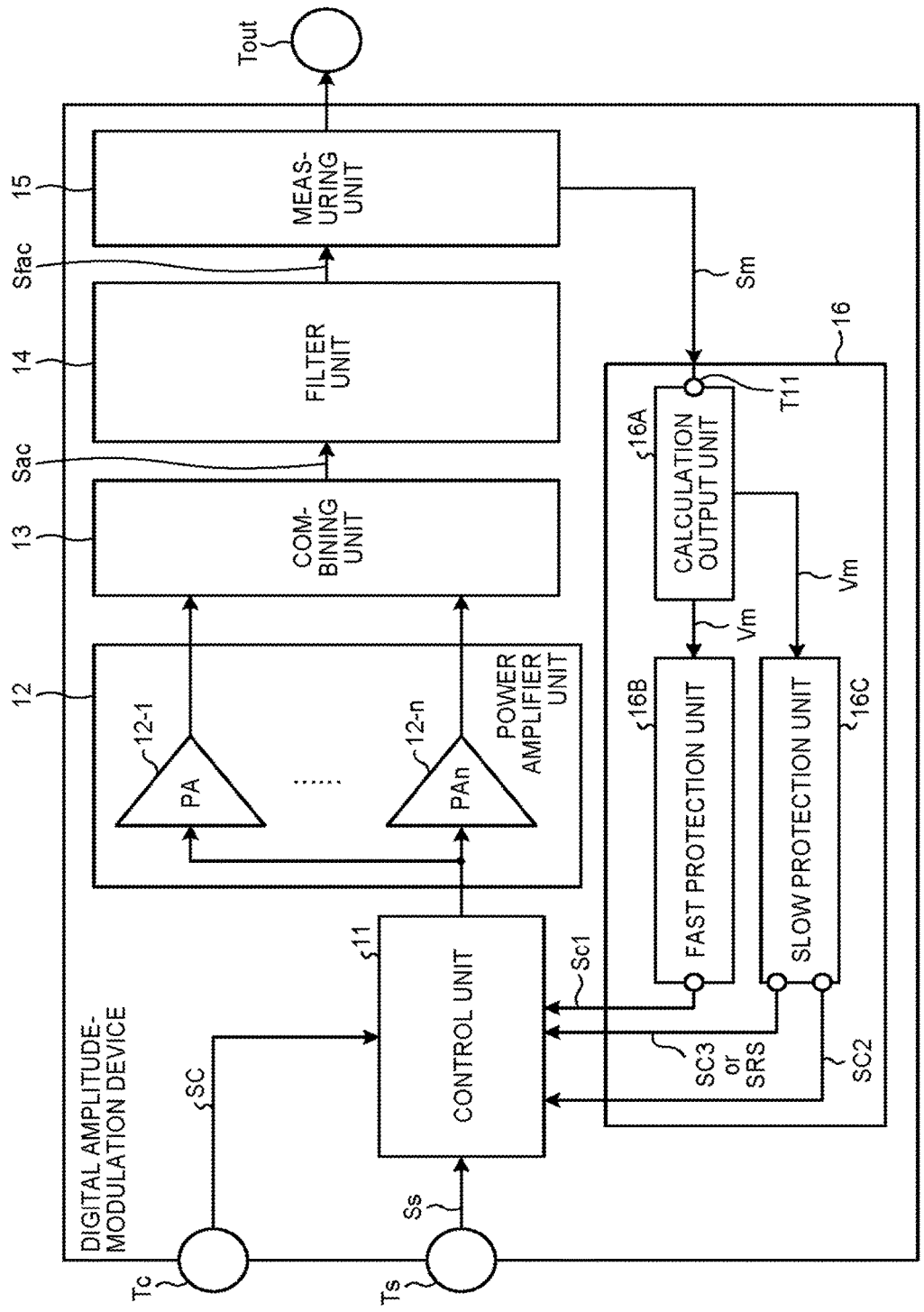
FIG. 1 is a functional configuration block diagram of a digital amplitude modulation device of a first embodiment.

FIG. 1 is a functional configuration block diagram of a digital amplitude modulation device of a first embodiment.

A digital amplitude-modulation device 10 generally includes a control unit 11, a power amplifier unit 12, a combining unit 13, a filter unit 14, a measuring unit 15, a protection unit 16, a carrier-signal input terminal Tc, and a sound-signal input terminal Ts.

To the carrier-signal input terminal Tc, a carrier signal Sc as a transmission signal is input.

To the sound-signal input terminal Ts, a sound signal Ss, which is a modulation signal, is input.

The control unit 11 controls the overall digital amplitude-modulation device 10 as described later.

The power amplifier unit 12 includes n power amplifiers (PA) 12-1 to 12-n. The carrier signal Sc input to the carrier-signal input terminal Tc is input to the power amplifiers 12-1 to 12-n through the control unit 11.

The ON/OFF of the respective power amplifiers 12-1 to 12-n are controlled under the control of the control unit 11. When controlled to be ON, the power amplifiers 12-1 to 12-n are brought in a driving state to amplify the input carrier signal Sc to a preset level. When controlled to be OFF, the power amplifiers 12-1 to 12-n are placed in a stop state and inhibited from outputting.

The combining unit 13 receives output signals from the power amplifiers 12-1 to 12-n, combines the amplified carrier signals to generate a combined amplified carrier signal Sac and output it to the filter unit 14.

The filter unit 14 suppresses an unnecessary component such as noise in the combined signal by filtering (wave filtering) the combined signal by the combining unit 13, and outputs a filtering combined signal Sfac. The filter unit 14 then outputs the filtering combined signal Sfac from a signal output terminal Tout through the measuring unit 15 as an amplitude-modulated broadcast wave in an RF band (AM wave).

In a stage following the signal output terminal Tout, a matching circuit, a filter, a rejecter, and a trap circuit not shown are provided, and through these elements, a not-shown transmission antenna is connected.

The measuring unit 15 measures a voltage value and a current value of the filtering combined signal Sfac that is a broadcast wave input from the filter unit 14. The measuring unit 15 outputs the measured voltage value and current value to the protection unit 16 as a measurement signal Sm.

The protection unit 16 includes a calculation output unit 16A that functions as an arithmetic unit that calculates a value Vm from the measurement signal Sm output from the measuring unit 15 in a predetermined manner for output.

The protection unit 16 further includes a fast protection unit 16B configured as an analog circuit as described later, to function as a first protection unit that outputs, based on the calculated value Vm, a first control signal SC1 to turn all of the ON-controlled power amplifiers 12-x (x: 1 to n) to an OFF state.

The protection unit 16 further includes a slow protection unit 16C configured as a complex circuit of an analog circuit and a digital circuit, that outputs, based on the calculated value Vm, a second control signal SC2 to control the maximum number of power amplifiers that can be in the ON-controlled state in parallel, and a third control signal SC3 to place the initial number or the above maximum number or less of power amplifiers 12-x (x: 1 to n) in the ON/OFF state.

A configuration of the protection unit 16 is explained in further detail.

Figure 2:
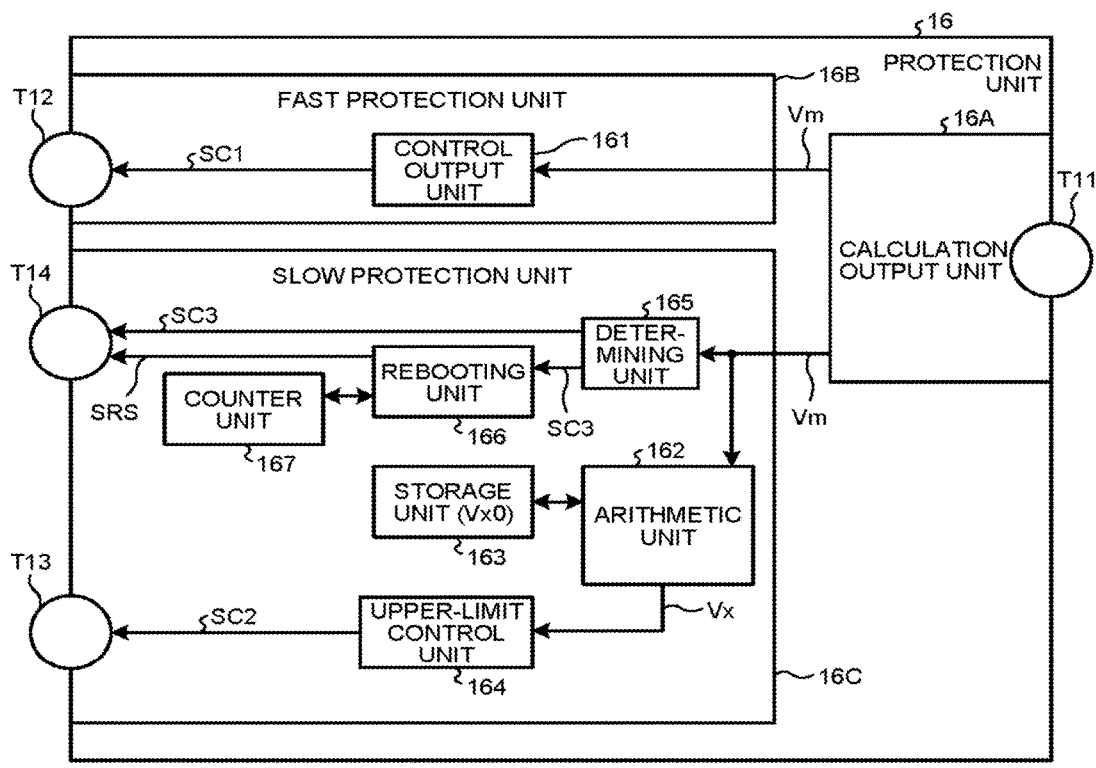
FIG. 2 is a functional configuration block diagram of a protection unit.

FIG. 2 is a functional configuration block diagram of the protection unit 16.

The calculation output unit 16A is configured as an analog circuit including an analog IC such as an operational amplifier, and includes a measured-value input terminal T11. To the measured-value input terminal T11, the voltage value and the current value measured by the measuring unit 15 are input as measured values. The calculation output unit 16A performs addition, subtraction, division, or smoothing on the measured voltage value and current value from the measured-value input terminal T11 for output as the calculated value Vm to the fast protection unit 16B and the slow protection unit 16C.

Note that it is possible to calculate the calculated value Vm from a voltage value and another voltage value that differs in phase by $\pi/2$ from the voltage value.

The fast protection unit 16B includes, for example, a control output unit 161 made of an analog circuit including an analog IC such as an operational amplifier or a comparator, and a first-control-signal output terminal T12.

The control output unit 161 outputs, through the first-control-signal output terminal T12 to the control unit 11, the first control signal SC1 to turn all of the ON-controlled power amplifiers 12-x (x: 1 to n) to the OFF state when the calculated value Vm output from the calculation output unit 16A is equal to or larger than a first reference value as a preset threshold.

A pulse width of the first control signal SC1 is set to be longer than a calculation delay time in the slow protection unit 16C configured as the complex circuit of an analog circuit and a digital circuit. This is to prevent cancellation of protection by the fast protection unit 16B before protection by the slow protection unit 16C starts.

The slow protection unit 16C is, for example, configured as a complex circuit of an analog circuit including an analog IC such as an operational amplifier or an A/D converter, and a digital circuit such as a CPU, a CPLD, and an FPGA.

The slow protection unit 16C includes an arithmetic unit 162, a storage unit 163, an upper-limit control unit 164, a second-control-signal output terminal T13 that outputs the second control signal SC2, a determining unit 165, a rebooting unit 166, a counter unit 167, and a third-control-signal output terminal T14 that outputs a third control signal SC3 and a reboot signal SRS.

The arithmetic unit 162 of the slow protection unit 16C calculates an evaluation value Vx, such as a standing wave ratio (SWR), a reflection coefficient, a reflected power, based on the calculated value Vm output from the calculation output unit 16A.

In the arithmetic unit 162, the evaluation value Vx is corrected based on an initial evaluation value Vx0 stored in the storage unit 163 in advance, and output to the upper-limit control unit 164.

By correcting the evaluation value Vx, the arithmetic unit 162 can remove an influence of errors in the calculation and smoothing circuit as the analog circuit including the calculation output unit 16A and the slow protection unit 16C, or noise in the circuit such as the A/D converter and more accurately calculate the evaluation value Vx.

To calculate the reflection coefficient as the evaluation value Vx, an initial impedance or output power can be stored in the storage unit 163 in addition to an initial reflection coefficient (=initial evaluation value Vx0) to calculate an impedance, output power, or reflected power at the time of measurement.

The upper-limit control unit 164 has multiple second reference values Vref2 stored therein in advance, and sets, to an upper limit value, the number of the power amplifiers 12-1 to 12-n to be ON-controlled according to the second reference value when the evaluation value Vx, such as SWR, the reflection coefficient, the reflected power, or output from the arithmetic unit 162 exceeds the second reference value Vref2.

For example, suppose that, there are two second reference values Vref2, that is, Vref2A and Vref2B (Vref2A>Vref2B).

In this case, when the second reference value Vref2A>the evaluation value Vx>the second reference value Vref2B holds true,
the upper-limit control unit 164 sets the maximum number of the power amplifiers that can be in the ON-controlled state in parallel to n/2. For example, when n=10, the second control signal SC2 that specifies the maximum number of the power amplifiers that can be in the ON-controlled state in parallel as five is output from the second-control-signal output terminal T13.

Moreover, when the evaluation value Vx>the second reference value Vref2A>the second reference value Vref2B holds true,
the upper-limit control unit 164 sets the maximum number of the power amplifiers that can be in the ON-controlled state in parallel to n/5. For example, when n=10, the second control signal SC2 that specifies the maximum number of the power amplifiers that can be in the ON-controlled state in parallel as two is output from the second-control-signal output terminal T13. Note that the second reference value Vref2 is set appropriately depending on the device.

Moreover, the slow protection unit 16C can be configured to function to generate, from the measured value by the measuring unit 15, the calculated value Vm to be output from the calculation output unit 16A. With such a configuration, the measured value (a voltage value and a current value) by the measuring unit 15 is not through the calculation output unit 16A but directly input to the arithmetic unit 162, and the arithmetic unit 162 generates the calculated value Vm for output to the determining unit 165.

The determining unit 165 generates a third control signal SC3 when the input calculated value Vm is equal to or larger than a third reference value Vref3 that is a preset threshold.

The status of the third control signal SC3 is set to STOP (a power amplifier 12-X is placed in OFF state by the third control signal SC3).

The determining unit 165 outputs the generated third control signal SC3 to the control unit 11 and the rebooting unit 166 through the third-control-signal output terminal T14.

After a predetermined time has passed from receiving the third control signal SC3, the rebooting unit 166 outputs, to the control unit 11 through the third-control-signal output terminal T14, the reboot signal SRS to change the status of the third control signal SC3.

Herein, the predetermined time for the rebooting unit 166 is defined to be a length of time to the output of the reboot signal SRS from the status change of the third control signal SC3 to STOP, and the time is longer than the calculation delay time in the slow protection unit 16C.

The reboot signal SRS works as an instruction for the control unit 11 to change the status of the third control signal SC3 so as to set the upper limit number of the power amplifiers 12-1 to 12-n controlled to be ON in parallel to the number (initial state) before the input calculated value Vm becomes equal to or higher than the third reference value Vref3 as a preset threshold), or to the upper limit number specified by the second control signal SC2 during the predetermined pulse width.

The status of the third control signal SC3 is changed to RUN (the initial number or upper limit number or less of the power amplifiers 12-x (x: 1 to n) specified by the second control signal SC2 is brought in the ON/OFF state by the third control signal SC3 according to a voltage amplitude level of the sound signal). The predetermined pulse width corresponds to a length of time shorter than a minimum allowable time for the power amplifiers 12-1 to 12-n (for example, a shortest time 100 µs, in which the power amplifiers 12-1 to 12-n are prevented from being heated and damaged due to a overcurrent supplied by a short circuit in a load).

After elapse of the time corresponding to the predetermined pulse width, the rebooting unit 166 outputs the reboot signal SRS to change the status of the third control signal SC3 to the control unit 11 from the third-control-signal output terminal T14.

Thus, the rebooting unit 166 instructs the control unit 11 to perform the OFF control of the power amplifiers 12-1 to 12-n by changing the status of the third control signal SC3. The status of the third control signal SC3 is changed to STOP (the power amplifier 12-X is placed in the OFF state by the third control signal SC3).

The rebooting unit 166 outputs the reboot signal SRS to the control unit 11 and increments a count value of the counter unit 167 to count the number of reboots.

Accordingly, when the calculated value Vm exceeds the third reference value Vref3, the rebooting unit 166 outputs a set of the reboot signals SRS repeatedly with intervals of a time (the predetermined time) longer than the calculation delay time in the slow protection unit 16C and of a time (corresponding the predetermined pulse width) shorter than the minimum allowable time for the power amplifiers 12-1 to 12-n, and increments the count value of the counter unit 167 each time it outputs the reboot signal SRS or the set of the reboot signals SRS.

The rebooting unit 166 ends the output of the reboot signal SRS while maintaining the status of the third control signal SC3 at STOP (while maintaining the OFF state of the power amplifier 12-X by the third control signal SC3), if the calculated value Vm remains equal to or larger than the third reference value Vref3 until the count value of the counter unit 167 reaches the preset upper limit number. If the non-normal condition that the calculated value Vm is equal to or higher than the third reference value Vref3 is resolved before outputting the reboot signal SRS, it ends the generation of the third control signal SC3 and resets the count value.

In the above configuration, the rebooting unit 166 can be further configured to store multiple count thresholds for the count value of the counter unit 167 in advance, and instruct the control unit 11 to output an output power while controlling the upper limit number of the power amplifiers 12-1 to 12-n to be ON-controlled (to further reduce output power each time the count threshold value is exceeded, that is, while lowering the upper limit value) before the count value reaches the upper limit number.

Explanation is given on the initial state as an example.

For example, when a count threshold ThA (count threshold ThA<upper limit number) is assumed, the upper limit number of the power amplifiers 12-1 to 12-n to be ON-controlled in parallel is set to the number (initial state) before the calculated value Vm becomes equal to or larger than the third reference value Vref3 while the count value of the counter unit 167 is smaller than the count threshold ThA. When the count value of the counter unit 167 reaches or exceeds the count threshold ThA, the upper limit number of the power amplifiers 12-1 to 12-n to be ON-controlled is set to ½ of the initial number (automatic reduced output power function).

As described, the rebooting unit 166 and the counter unit 167 of the slow protection unit 16C and the automatic output power reduction function to reduce the upper limit number of the power amplifiers 12-1 to 12-n to be on-controlled in parallel are implemented by digital circuits. Therefore, compared to the one including only an analog circuit similar to the fast protection unit 16B, the slow protection unit 16C can be inhibited from increasing in circuit scale.

Furthermore, although a calculation delay amount occurs in the complex circuit of an analog circuit and a digital circuit functioning as the fast protection unit 16B, the calculation delay amount exerts no influence because the fast protection unit 16B made of an analog circuit handles protection processing.

Note that the second control signal SC2 is output when neither first control signal SC1 nor the third control signal SC3 is output. However, while the second control signal SC2 is output, the first control signal SC1 and the third control signal SC3 can be output. In this case, the upper limit number of the power amplifiers that can be ON-controlled in parallel is set to the value specified by the second control signal SC2 as the initial number.

Specifically, for example, when the third reference value Vref3≈the first reference value Vref1>a protection index≥the second reference value Vref2 is satisfied, only the second control signal SC2 is output.

The protection index herein signifies the calculated value Vm or the evaluation value Vx.

Therefore, a difference in the calculated values Vm or the evaluation values Vx as the protection index between the fast protection unit 16B and the slow protection unit 16C, an influence of noise and an influence of noise in the slow protection unit 16C are removed.

When the condition of reduced output power protection (while the upper limit number of the power amplifiers 12-1 to 12-$n$ that can be in the ON state in parallel is set by the second control signal SC2) turns to the condition that the protection index≥the third reference value Vref3≈the first reference value Vref1, it operates in a state that the upper limit number of the power amplifiers 12-1 to 12-$n$ to be in the ON state in parallel specified by the second control signal SC2 is maintained.

Figure 3:
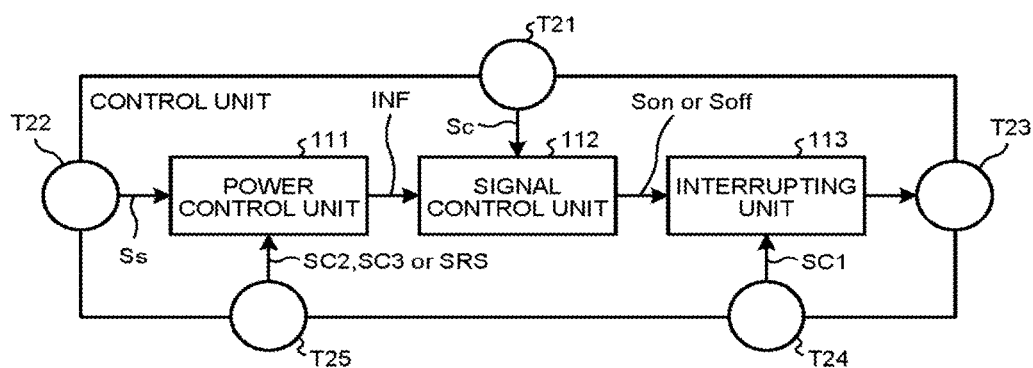
FIG. 3 is a functional configuration block diagram of a control unit.

FIG. 3 is a functional configuration block diagram of the control unit 11.

The control unit 11 includes a power control unit 111, a signal control unit 112, an interrupting unit 113, a carrier-signal input terminal T21, a sound-signal input terminal T22, a control-signal output terminal T23, and control-signal input terminals T24, T25 as shown in FIG. 3. To the control-signal input terminal T24, the first control signal SC1 is input, and to the control-signal input terminal T25, the second control signal SC2, the third control signal SC3, and the reboot signal SRS are input.

The power control unit 111 receives a sound signal SS that is a modulation signal input to the sound-signal input terminal T22, the second control signal SC2, the third control signal SC3, and the reboot signal SRS that are output from the slow protection unit 16C to the control-signal input terminal T25.

The power control unit 111 determines which ones of the power amplifiers 12-1 to 12-$n$ are to be ON-controlled according to a voltage amplitude level of the sound signal. The number of the power amplifiers to be ON-controlled should be the upper limit number or less of power amplifiers that can be in the ON-controlled state in parallel specified by the second control signal SC2.

Alternatively, while the third control signal SC3 is not generated (initial state) or the status of the third control signal SC3 is RUN, the power control unit 111 determines which ones of the power amplifiers 12-1 to 12-$n$ to be ON-controlled according to a voltage amplitude level of the sound signal. The number of the power amplifiers to be ON-controlled should be the upper limit number or less of the power amplifiers that can be in the ON-controlled state in parallel in the initial state, in the automatic reduced output power state, or specified by the second control signal SC2.

Moreover, when the status of the third control signal SC3 is STOP, all of the ON-controlled power amplifiers 12-$x$ (x: 1 to n) are turned to the OFF state. That is, when receiving the third control signal SC3 having the STOP status or receiving the reboot signal SRS to change the status of the third control signal SC3 to STOP, the power control unit 111 sets the upper limit number of the power amplifiers 12-1 to 12-$n$ to be ON-controlled to 0, thereby bringing the digital amplitude-modulation device 10 in an output stop state equivalently.

The power control unit 111 then outputs information TNF that indicates which one or more of the power amplifiers 12-1 to 12-$n$ are ON/OFF controlled, to the signal control unit 112.

The signal control unit 112 receives the carrier signal Sc from the carrier-signal input terminal T21 and the information INF from the power control unit 111.

The signal control unit 112 refers to the input information INF to output ON/OFF control signals Son/Soff indicating the ON state to power amplifiers to be ON-controlled, and output ON/OFF control signals Son/Soff indicating the OFF state to power amplifiers to be OFF-controlled, according to the frequency of the carrier signal Sc.

The ON/OFF control signals Son/Soff can be for controlling the power amplifiers by changing the level or phase of the carrier signal. A control method by changing either the signal level or phase of the carrier signal can be arbitrarily adopted depending on a device.

The interrupting unit 113 receives the ON/OFF control signal Son/Soff generated by the signal control unit 112, and the first control signal SC1 output from the fast protection unit 16B to the control-signal input terminal T24.

The interrupting unit 113 handles the first control signal SC1 having higher urgency in preference to the ON/OFF control signal Son/Soff input from the signal control unit 112, and outputs an OFF control signal Soff to all of the power amplifiers 12-1 to 12-$n$, specified by the first control signal SC1. When the first control signal SC1 is not generated or when the status of the first control signal SC1 is RUN, the interrupting unit 113 outputs the ON/OFF control signal Son/Soff input from the signal control unit 112.

Note that FIG. 3 merely shows one example of the configuration of the control unit 11. For example, the functions of the power control unit 111, calculating the number of the power amplifiers 12-1 to 12-$n$ to be ON-controlled and calculating the information on which ones of the power amplifiers 12-1 to 12-$n$ are to be ON/OFF-controlled can be provided separately.

Next, the control operation for the power amplifiers 12-1 to 12-$n$ in the digital amplitude-modulation device 10 will be explained according to the processings of the protection unit 16 and the control unit 11.

First, the condition that the protection index≥the third reference value Vref3≈the first reference value Vref1 holds true is explained. In this condition, the second control signal is not output, and the first control signal SC1, the third control signal SC3, and the reboot signal SRS are output.

A processing in this condition is hereinafter referred to as a first processing.

In the first processing, the condition that protection index<the third reference value Vref3≈the first reference value Vref1 holds true is regarded as normal, and the condition that the protection index≥the third reference value Vref3≈the first reference value Vref1 holds true is regarded as non-normal.

Figure 4:
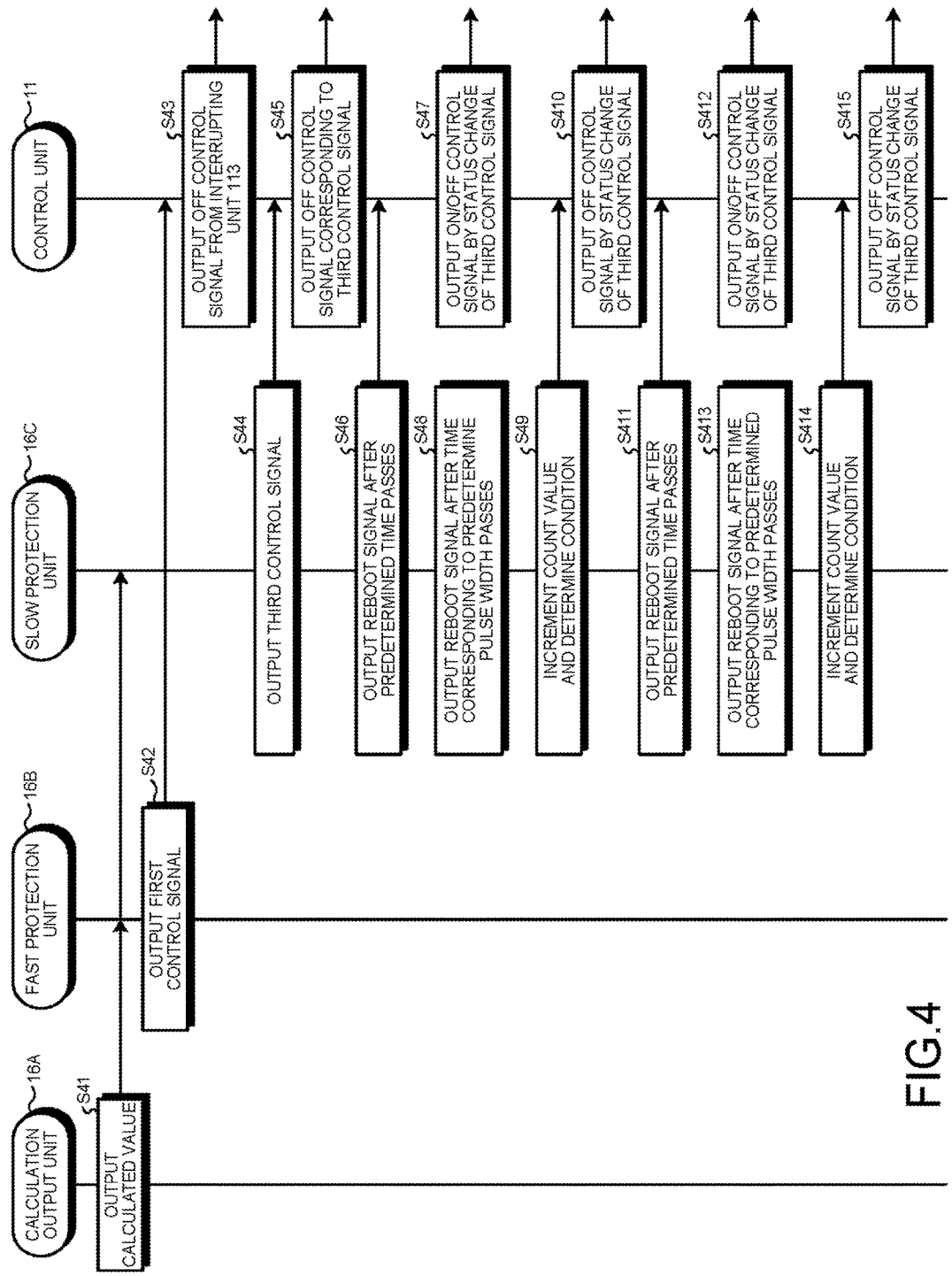
FIG. 4 is a sequence diagram showing a processing of a protection unit and the control unit.

FIG. 4 is a sequence diagram showing the processings of the protection unit 16 and the control unit 11.

Figure 5:
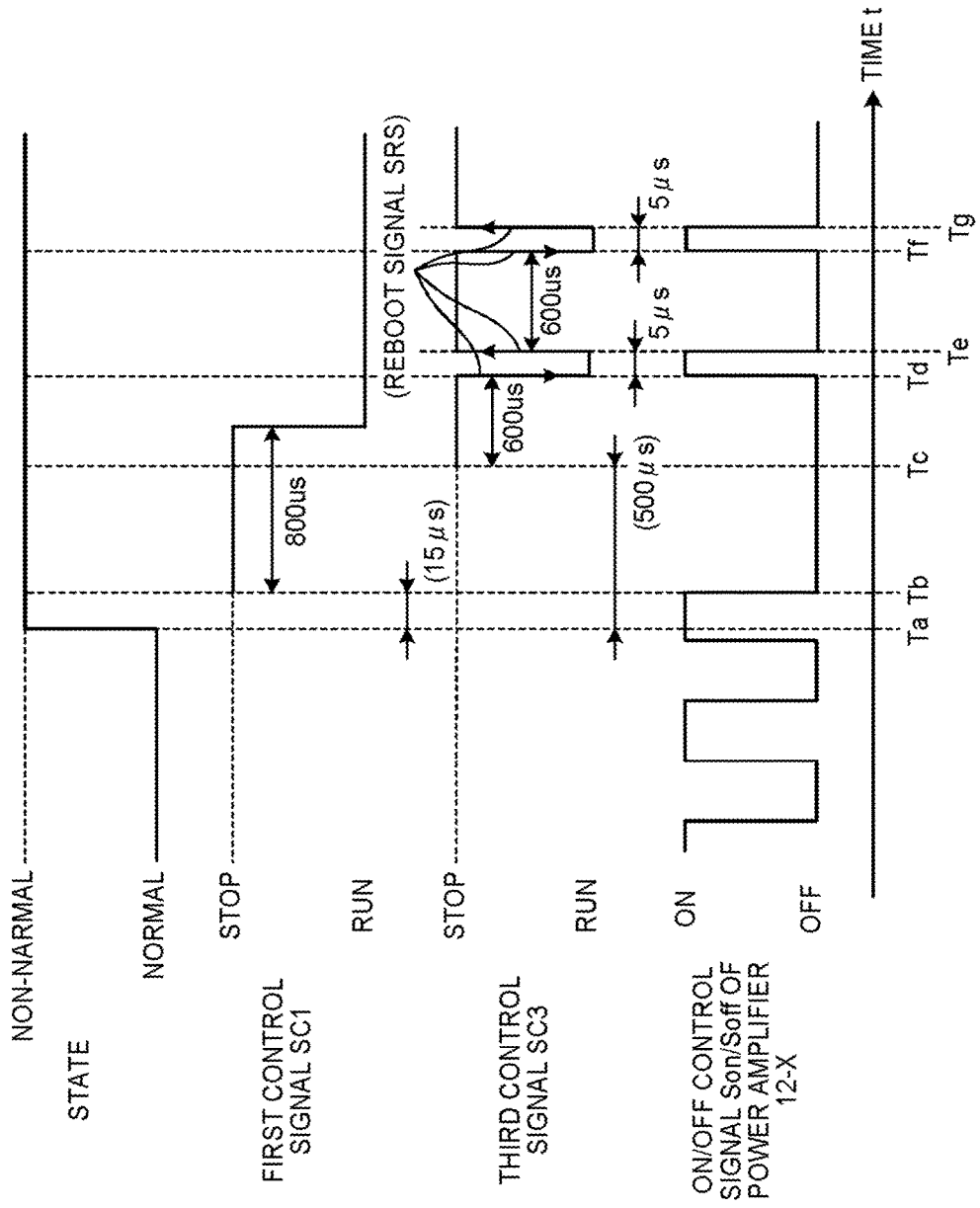
FIG. 5 is a time transition diagram of a control over power amplifiers.

FIG. 5 is a time transition diagram of the control over the power amplifier unit 12.

As shown in FIG. 5, the ON/OFF control signal Son/Soff in the power amplifiers 12-x (1 to n) of the power amplifier unit 12 repeats ON and OFF in a cycle according to the control until a time Ta.

First, in FIG. 4, the calculation output unit 16A performs an arithmetic operation to the measured value by the measuring unit 15 for output to the fast protection unit 16B and the slow protection unit 16C (step S41).

When determining occurrence of anomaly at the time Ta in FIG. 5 and the non-normal condition (the protection index≥the first reference value Vref1), the fast protection unit 16B generates the first control signal SC1 at a time Tb, and sets the status of the first control signal SC1 to STOP (all of the ON-controlled power amplifiers 12-x (x: 1 to n) are turned to the OFF state). The fast protection unit 16B then outputs the generated first control signal SC1 to the control unit 11 as shown in FIG. 4 (step S42).

Because the first control signal SC1 is a pulse signal having a certain width, the status of the first control signal SC1 is turned to RUN at a certain timing (similarly to no generation of the first control signal SC1, one or more of the power amplifiers is/are placed in the ON/OFF state according to a voltage amplitude level of the sound signal). The certain width is, for example, 800 s, and defined to be longer than the calculation delay time of the slow protection unit 16C, therefore, the protection by the fast protection unit 16B is avoided from being cancelled before the start of the protection by the slow protection unit 16C.

A length of time from the occurrence of anomaly to the output of the first control signal SC1, that is, the amount of calculation throughput of the control output unit 161, is about Tb−Ta=15 μs smaller than the minimum allowable time (for example, 100 μs) of the power amplifiers 12-x.

When receiving the first control signal SC1, the control unit 11 outputs the off control signal Soff to the power amplifiers 12-x from the interrupting unit 113 (step S43). As a result, all of the ON-controlled power amplifiers 12-x (x: 1 to n) are turned to the OFF state.

Determining the non-normal condition (the protection index≥the third reference value Vref3) due to the occurrence of anomaly at the time Ta in FIG. 5, the slow protection unit 16C generates the third control signal SC3 at a time Tc after elapse of the calculation delay time for calculation. The slow protection unit 16C then sets the status of the third control signal SC3 to STOP (the power amplifiers 12-X are placed in the off state by the third control signal SC3), and outputs the third control signal SC3 to the control unit 11 (step S44).

The length of time to the output of the third control signal SC3 from the occurrence of the anomaly, that is, the calculation delay time of the determining unit 165 is, for example, Tc−Ta=500 μs larger than the minimum allowable time (for example, 100 μs) of the power amplifier 12-x.

When receiving the third control signal SC3, the control unit 11 sets the upper limit number of the power amplifiers 12-1 to 12-n to be ON-controlled to 0 to create the output stop state equivalently, and outputs the off control signal Soff to the power amplifiers 12-x (step S45).

For controlling the power amplifiers 12-x, as shown in FIG. 5, the control unit 11 generates the off control signal, and continues to output the off control signal Soff corresponding to the third control signal SC3 after stopping outputting the off control signal Soff corresponding to the first control signal SC1.

As a result, the power amplifier 12-x is continuously in the OFF state.

Subsequently, the slow protection unit 16C generates and outputs the reboot signal SRS at a time Td when a predetermine time elapses after outputting the third control signal SC3 (step S46). This reboot signal SRS changes the status of the third control signal SC3 from STOP to RUN (the power amplifiers 12-x (x: 1 to n) are placed in the ON/OFF state by the third control signal SC3 according to a voltage amplitude level of the sound signal).

The predetermine time is, for example, Td−Tc=600 μs longer than 500 μs, which is the calculation delay time of the determining unit 165.

When receiving the reboot signal SRS, the control unit 11 outputs the ON/OFF control signal Son/Soff for changing the status of the third control signal SC3 to RUN, to place the power amplifier 12-x (x: 1 to n) in the ON/OFF state according to a voltage amplitude level of the sound signal (step S47).

The slow protection unit 16C outputs, to the control unit 11, the reboot signal SRS for changing the status of the third control signal SC3 from RUN to STOP after elapse of a time equivalent to the predetermined pulse width of, for example, 5 μs (step S48), and increments the count value of reboots and determines the condition (step S49).

Herein, the determination of condition refers to the slow protection unit 16C's calculating the protection index in the output state at step S47 and determining whether the non-normal condition that the protection index is equal to or larger than the third reference value Vref3 (the protection index≥the third reference value Vref3) is resolved.

The time equivalent to the predetermine pulse width (for example, 5 μs) is smaller than the minimum allowable time (for example, 100 μs) of the power amplifier 12-x, therefore, the power amplifier is prevented from being damaged even in the non-normal condition during the output state.

The reboot signal SRS generated at step S48 changes the status of the third control signal SC3 from RUN to STOP. When receiving the reboot signal SRS, the control unit 11 outputs, to the power amplifiers 12-x, the off control signal Soff for setting the upper limit number of the power amplifiers 12-1 to 12-n to be ON-controlled to 0 to create the output stop state equivalently (step S410).

In the control of the power amplifiers 12-x, as shown in FIG. 5, when receiving the reboot signal SRS at the time Td at step S47, the control unit 11 outputs the ON/OFF control signal Son/Soff for putting the power amplifiers 12-x (x: 1 to n) in the ON/OFF state according to a voltage amplitude level of the sound signal. As a result, the power amplifiers 12-x are in the ON state.

When receiving the reboot signal SRS at a time Te after elapse of the predetermine pulse width at step S48, the control unit 11 outputs, to the power amplifiers 12-x, the OFF control signal Soff for setting the upper limit number of the power amplifiers 12-1 to 12-n to be ON-controlled to 0 to create the output stop state equivalently. As a result, the power amplifiers 12-x are in the OFF state.

When determining that the non-normal condition is not resolved in the determination at step S49, the slow protection unit 16C outputs the reboot signal SRS again at a time Tf after elapse of the predetermined time from the time Te (step S411). This reboot signal SRS changes the status, which has been changed from RUN to STOP by the reboot signal SRS at step S48, from STOP to RUN.

The length of time from the time Te to the time Tf is, for example, 600 μs longer than 500 μs of the calculation delay time of the determining unit 165, therefore, the reboot signal SRS is not to be output before completion of the determination.

When receiving the reboot signal SRS, the control unit 11 outputs the ON/OFF control signal Son/Soff for changing the status of the third control signal SC3 to RUN to put the power amplifiers 12-*x* (x: 1 to n) in the ON/OFF state according to a voltage amplitude level of the sound signal (step S412).

The slow protection unit 16C outputs the reboot signal SRS for changing the status of the third control signal SC3 from RUN to STOP to the control unit 11 at a time Tg after elapse of the predetermine pulse width (step S413), and increments the count value of reboots and determine a condition (step S414).

The reboot signal SRS generated at step S413 changes the status of the third control signal SC3 from RUN to STOP. When receiving the reboot signal SRS, the control unit outputs, to the power amplifiers 12-*x*, the OFF control signal Soff for setting the upper limit number of the power amplifiers 12-1 to 12-*n* to be ON-controlled to 0 to create the output stop state equivalently (step S415).

In the operation explained in FIG. 4 and FIG. 5, the number of reboots is set to two.

Accordingly, when the non-normal condition that the protection index≥the third reference value Vref3≈the first reference value Vref1 is not resolved even after rebooting twice, the slow protection unit 16C ends the rebooting and thereafter maintains the OFF state of the power amplifiers 12-*x*.

Another mode of the first embodiment is explained herein.

In the first processing, the rebooting unit 166 has multiple count thresholds for the count value of the counter unit 167 stored therein, and is able to control the output of an output signal while controlling the upper limit number of the power amplifiers 12-1 to 12-*n* to be ON-controlled before the count value reaches the upper limit number.

The above control will be explained below.

For example, a description is made on a case in which the upper limit number of reboots is set to five and one of the count thresholds of the counter unit 167 is 1.

First, when the count value of the counter unit 167 is less than one (the count value<the threshold of 1 one), the upper limit number of the power amplifiers 12-1 to 12-*n* to be ON-controlled is set to the number in the normal condition in the processing equivalent to step S49.

On the other hand, when the count value of the counter unit 167 is one or more (the count value≥the threshold of 1), the upper limit number of the power amplifiers 12-1 to 12-*n* to be ON-controlled is set to, for example, a half of the initial value (n/2) in the processing equivalent to step S412. Thus, it is placed in the automatic reduced output power state in which a transmission output is automatically reduced, aiming for recovering from the non-normal condition.

Still another mode is explained.

Assuming that the condition that the second reference value Vref2≤the protection index<the third reference value Vref3≈the first reference value Vref1 is to be normal, the upper limit number of the power amplifiers 12-1 to 12-*n* to be ON-controlled specified by the second control signal SC2 is an initial upper limit value (corresponding to a value in the initial state) of the number of the power amplifiers 12-1 to 12-*n* to be ON-controlled in the normal condition.

Therefore, in the first processing, in the processing corresponding to step S49 or step S412, the upper limit number of the power amplifiers 12-1 to 12-*n* to be ON-controlled is set to the initial number, that is, the upper limit number of the power amplifiers 12-1 to 12-*n* to be ON-controlled specified by the second control signal SC2.

Next, a description will be made on a second processing by the protection unit 16 and the control unit 11 (hereinafter, referred to as the second processing) while only the second control signal SC2 is output when the third reference value Vref3≈the first reference value Vref1>the protection index≥the second reference value Vref2 is satisfied.

In the second processing, the condition that the protection index<the second reference value Vref2 holds true is regarded as normal, and the condition that the third reference value Vref3≈the first reference value Vref1>the protection index≥the second reference value Vref2 holds true is regarded as non-normal.

Figure 6:
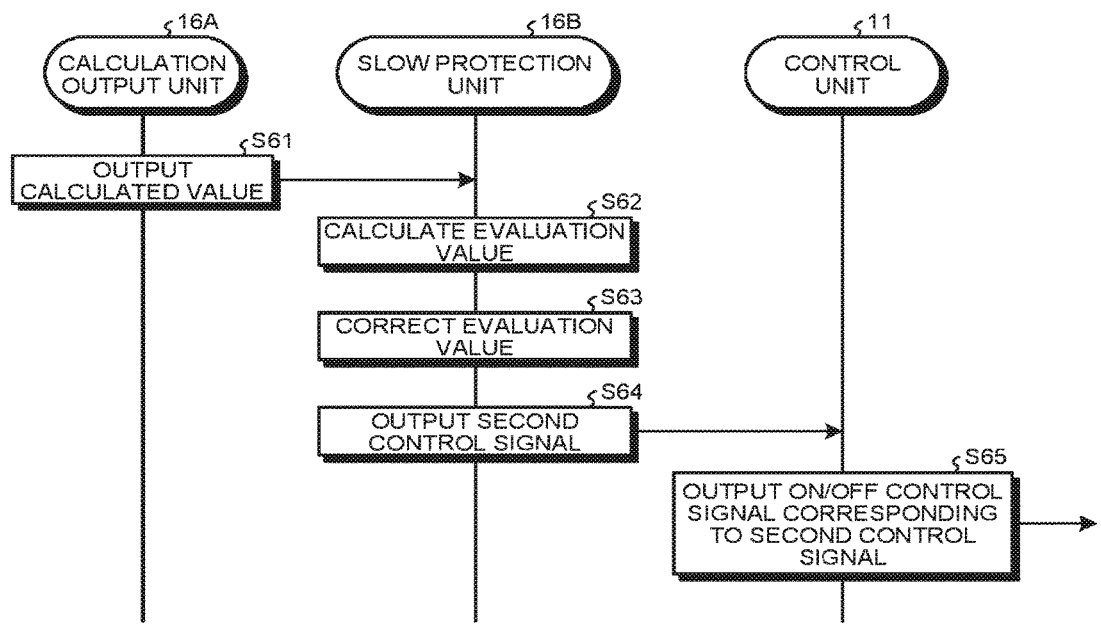
FIG. 6 is a sequence diagram showing a processing of a protection unit 16 and a control unit 11 in a second processing.

FIG. 6 is a sequence diagram showing the second processing by the protection unit 16 and the control unit 11.

FIG. 6 is the sequence diagram showing the processings by the protection unit 16 and the control unit 11 in the second processing.

First, in FIG. 6, the calculation output unit 16A performs an arithmetic operation to the measured value by the measuring unit 15 for output to the slow protection unit 16C (step 361).

The arithmetic unit 162 of the slow protection unit 16C calculates the evaluation value Vx such as an SWR (standing wave ratio), a reflection coefficient, and a reflected power based on the calculated value output from the calculation output unit 16A (step S62). The protection index signifies the calculated value Vm or the evaluation value Vx, therefore, the following will be described using the valuation Vx.

The arithmetic unit 162 corrects the evaluation value Vx based on the initial evaluation value Vx0 stored in the storage unit 163 in advance (step S63), and outputs it to the upper-limit control unit 164. By correcting the evaluation value Vx, errors in the calculation and smoothing circuit as an analog circuit that constitutes the calculation output unit 16A and the slow protection unit 16C and an influence of noise in a circuit such as an A/D converter can be removed, resulting in calculation of further accurate evaluation values. The upper-limit control unit 164 has the multiple second reference values Vref2 stored therein, and sets, as the upper limit value, the number of the power amplifiers 12-1 to 12-*n* to be ON-controlled according to the second reference value Vref2 when the evaluation value Vx as any of the SWR, the reflection coefficient, and the reflected power output from the arithmetic unit 162 exceeds the second reference value Vref2, and outputs it as the second control signal SC2 (step S64). When receiving the second control signal SC2, the control unit 11 sets the upper limit number of the power amplifiers 12-1 to 12-*n* to be ON-controlled to the value specified by the second control signal SC2, thereby outputting the ON/OFF control signal Son/Soff corresponding to the second controls signal SC2 to the power amplifier 12-*x* (step S65).

As explained above, in the first embodiment, the calculation output unit 16A is made of an analog circuit to output the calculated value Vm based on the measured value. The fast protection unit 16B is configured to output, to the control unit 11, the first control signal SC1 to output the OFF control signal Soff to the power amplifiers 12-1 to 12-*n* when the calculated value Vm is equal to or larger than the first reference value Vref1 as a preset threshold.

An effect of the first embodiment is now explained in comparison with a conventional technique.

In a conventional digital amplitude modulation device that uses a digital circuit such as an MPU to calculate an SWR value as the evaluation value, a large time difference occurs due to calculation delay time between occurrence of anomaly and actual generation and output of an ON/OFF control signal Son/Soff.

Figure 7:
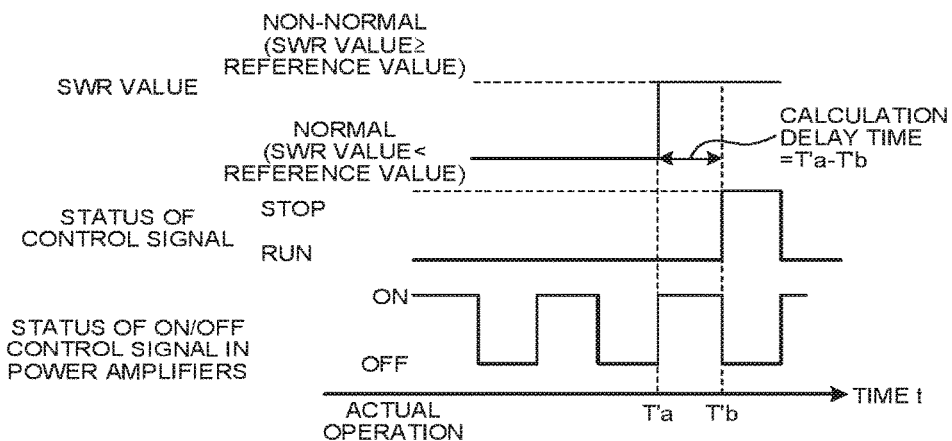
FIG. 7 is a diagram showing a time transition of an ON/OFF control signal that is generated in a conventional digital amplitude modulation device.

FIG. 7 is a diagram showing a time transition of the ON/OFF control signal that is generated in a conventional digital amplitude modulation device.

The calculation delay amount is, for example, about T'b−T'a=500 μs significantly larger than the minimum allowable time (for example, 100 μs) of power amplifiers. Therefore, the power amplifiers may not be protected in time and, as a result, subjected to a heavy load and damaged.

In contrast, according to the digital amplitude-modulation device 100 of the first embodiment, the calculation output unit 16A made of an analog circuit calculates the calculated values, and the fast protection unit 16B also made of an analog circuit outputs the first control signal SC1 to the control unit 11 to output the OFF control signal Soff to the power amplifiers 12-1 to 12-n.

This can shorten the delay amount from the occurrence of the anomaly to the output of the first control signal SC1. This enables the protection unit 16 to reduce the calculation delay time to smaller than the minimum allowance time (for example, 100 μs) of the power amplifier. Accordingly, the protection unit 16 can operate to protect the power amplifiers in time and prevent the power amplifiers from being damaged.

Thus, the digital amplitude-modulation device according to the first embodiment can follow sudden changes along with the occurrence of anomaly in actual time.

Moreover, for dealing with an anomaly accompanying sudden changes in the conventional digital amplitude modulation device, forming the protection unit with an analog circuit can be a conceivable measure.

A problem with an increase in the circuit scale arises when the protection unit made of an analog circuit calculates the evaluation value, calculates and manages the upper limit number of power amplifiers to be ON-controlled, manages the counts of a counter by managing time when the reboot signal is output.

In contrast, according to the first embodiment, the slow protection unit 16C as a complex circuit of an analog circuit and a digital circuit can be inhibited from increasing in the circuit scale, compared to the protection unit made of an analog circuit alone.

Moreover, in the control unit 11 of the first embodiment, the interrupting unit 113 is configured to output, to the power amplifiers 12-1 to 12-n, the OFF control signal according to the first control signal SC1 supplied from the fast protection unit 16B, even when supplied with the ON/OFF control signal from the signal control unit 112. This enables the control unit 11 to deal with the first control signal SC1 from the fast protection unit 16B promptly. That is, the control unit 11 can operate to protect the power amplifiers in a shorter period of time than the minimum allowance time (for example, 100 μs) of the power amplifiers, and to prevent the power amplifiers from being damaged.

Furthermore, in the first embodiment, the fast protection unit 16B is configured to set the pulse width of the first control signal SC1 to be longer than the calculation delay time in the slow protection unit 16C. This can prevent the occurrence of a time between the first control signal SC1 and the third control signal SC3 to prevent the power amplifiers from being damaged.

Moreover, the digital amplitude-modulation device 10 of the first embodiment includes the measuring unit 15 in a stage following the filter unit 14. This enables the measuring unit 15 to measure an anomaly that occurs between the measuring unit 15 and an antenna.

The first embodiment above has described an example where the control unit 11 adopts the configuration shown in FIG. 3 but it should not be limited thereto.

Figure 8:
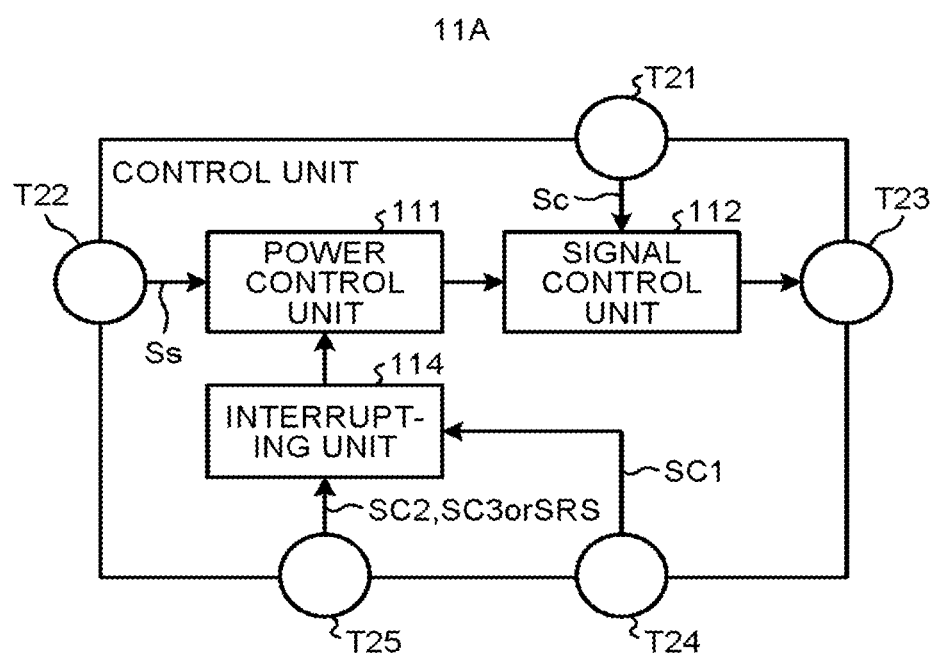
FIG. 8 is an explanatory diagram of a modification of the first embodiment.

FIG. 8 is an explanatory diagram of a modification of the first embodiment.

In FIG. 8, same or like reference symbols are assigned to same or like elements as those in FIG. 3.

In the present modification, a control unit 11A generally includes, as shown in FIG. 8, the power control unit 111, the signal control unit 112, an interrupting unit 114, the carrier-signal input terminal T21, the sound-signal input terminal T22, the first control-signal input terminal T24, and the second control-signal input terminal T25.

When the second control signal SC2 is input to the second control-signal input terminal T25, the interrupting unit 114 informs the power control unit 111 of the upper limit number, corresponding to the input second control signal SC2, (upper limit value in the reduced output power protection state) of the power amplifiers that can be in the ON state in parallel.

When the third control signal SC3 or the reboot signal SRS is input to the second control-signal input terminal T25, the interrupting unit 114 informs the power control unit 111 of the upper limit number of the power amplifiers that can be in the ON state in parallel according to the status of the input third control signal SC3.

Thus, the upper limit number of the power amplifiers that can be in the ON state in parallel to be informed to the power control unit 111 is any of the upper limit value in the reduced output power protection state (defined by the second control signal SC2), the set value in the initial state, the upper limit value in the automatic reduced output power state, and 0.

Moreover, when the first control signal SC1 is input to the first control-signal input terminal T24, the interrupting unit 114 informs the power control unit 111 of the upper limit number of the power amplifiers to be ON-controlled in parallel as 0.

The power control unit 111 receives the upper limit value instructed by the interrupting unit 114, and calculates the number of the power amplifiers 12-1 to 12-n to be ON/OFF controlled according to a voltage amplitude level of the sound signal Ss, the number of the power amplifiers being the informed upper limit value or less. The power control unit 111 outputs information about which ones of the power amplifiers 12-1 to 12-n to be ON/OFF controlled, to the signal control unit 112.

The power control unit 111 gives priority to the upper limit number (0) of the power amplifiers to be ON-controlled specified by the first control signal SC1. Thereby, the control unit 11 can deal with the first control signal SC1 from the fast protection unit 16B promptly.

That is, the control unit 11 can operate to protect the power amplifiers in a shorter period of time than the minimum allowance time (for example, 100 μs) of the power amplifiers and can prevent the power amplifiers from being damaged.

Furthermore, the first embodiment has described the example in which the rebooting unit 166 generates the reboot signal SRS having the predetermined pulse width (5 μs in FIG. 5) as shown in FIG. 5.

However, for example, the rebooting unit 166 can also instruct the control output unit 161 of the fast protection unit 16B to change the status of the first control signal SC1 together with outputting the reboot signal SRS.

[2] Second Embodiment

Next, a second embodiment will be explained.

FIG. 9 is a functional configuration block diagram of a digital amplitude modulation device according to the second embodiment.

In FIG. 9, same or like reference symbols are assigned to same or like elements as those in FIG. 1.

A digital amplitude-modulation device 10A includes, as shown in FIG. 9, the control unit 11, the power amplifier unit 12, the combining unit 13, a measuring unit 15A the filter unit 14, the protection unit 16, the carrier-signal input terminal Tc, and the sound-signal input terminal Ts, and the signal output terminal Tout.

The digital amplitude-modulation device 10A according to the second embodiment differs in that in place of the measuring unit 15 of the digital amplitude-modulation device 10 of the first embodiment, the measuring unit 15A is positioned in the stage following the combining unit 13 and preceding the filter unit 14.

The measuring unit 15A measures a voltage value and a current value of a combined signal supplied from the combining unit 13. Thus, the measuring unit 15A can measure an anomaly occurring between itself and the combining unit 13.

[3] Another Mode of Embodiment

In each of the above embodiments the fast protection unit 16B that functions as a first protection unit and the slow protection unit 16C that functions as a second protection unit both perform processing based on the calculated value Vm output from the calculation output unit 16A. Alternatively, the slow protection unit 16C can be configured to include an arithmetic unit having the same function as the calculation output unit 16A that outputs the calculated value Vm as a first calculated value, to add, subtract, divide, or smoothen a voltage value and a current value (or a voltage value and a voltage value that differs in phase by $\pi/2$ from the voltage value) as the measured values input through the measured-value input terminal T11 to this arithmetic unit to obtain a calculated value (second calculated value), and perform processing using this calculated value (second calculated value).

Several embodiments of the present invention have been explained, but these embodiments are presented as an example, and is not intended to limit the scope of the invention. These embodiments can be implemented by various other modes, and various omissions, replacement, and changes can be made within a range not departing from the gist of the invention. These embodiments and the modifications thereof are included in the scope and the gist of the invention, and are included in the invention described in the scope of claim and the scope of the equivalence thereof.

The invention claimed is:

1. A digital amplitude modulation device comprising:
    a power amplifier unit including a plurality of power amplifiers connected in parallel to be on/off controlled based on an input sound signal, that amplify power of an input carrier signal when the power amplifiers are an on-controlled state;
    a combining unit that combines outputs of the power amplifiers in the on-controlled state to output a combined output signal;
    a filter unit that filters the combined output signal for output as an amplitude modulation signal in an RF band through a signal output terminal;
    a calculation output unit configured as an analog circuit, that outputs a calculated value based on one of the combined output signal and the amplitude modulation signal;
    a first protection unit configured as an analog circuit, that outputs, based on the calculated value, a first control signal to place the entire amplifier unit in an off-controlled state;
    a second protection unit configured as a complex circuit of an analog circuit and a digital circuit, that outputs, based on the calculated value, a second control signal to control an upper limit number of the power amplifiers that can be in the on-controlled state in parallel and a third control signal to on/off control the upper limit number or less or the initial number of the power amplifiers; and
    a control unit that performs an on/off control of the power amplifiers of the power amplifier unit based on the sound signal, the first control signal, the second control signal, and the third control signal.

2. The digital amplitude modulation device according to claim 1, wherein
    the second protection unit includes a rebooting unit that outputs a reboot signal to change a status of the third control signal.

3. The digital amplitude modulation device according to claim 2, wherein
    the second protection unit further includes a rebooting unit that outputs a reboot signal to change a status of the first control signal.

4. The digital amplitude modulation device according to claim 2, wherein
    the second protection unit includes a counter unit that counts outputs of the reboot signal and that maintains the upper limit number of the power amplifiers that can be in the on-controlled state by the third control signal, or controls the upper limit number of the power amplifiers to reduce.

5. The digital amplitude modulation device according to claim 1, wherein
    the second control signal is output exclusively relative to the first control signal and the third control signal.

6. The digital amplitude modulation device according to claim 1, wherein
    the second protection unit includes
        an arithmetic unit that calculates an evaluation value based on the calculated value; and
        an upper-limit control unit that outputs the second control signal based on the evaluation value.

7. The digital amplitude modulation device according to claim 6, further comprising
    a storage unit that stores, in advance, an initial evaluation value that is an initial value of the evaluation value, wherein
    the arithmetic unit corrects the evaluation value acquired by calculation based on the initial evaluation value, and outputs the corrected evaluation value instead of the evaluation value acquired by calculation.

8. The digital amplitude modulation device according to claim 7, wherein
    a reflection coefficient is used as the evaluation value, and an impedance at a time of measurement is calculated from an impedance in an initial state stored in the storage unit, or one of an output power and a reflected power at a time of measurement is calculated based on information about an output power in an initial state stored in the storage unit.

9. The digital amplitude modulation device according to claim 6, wherein
the arithmetic unit generates at least one of an SWR, a reflection coefficient, and a reflected power as the evaluation value.

10. A digital amplitude modulation device comprising:
a power amplifier unit including a plurality of power amplifiers connected in parallel to be on/off controlled based on an input sound signal, and that amplify power of an input carrier signal when the power amplifiers are an on-controlled state;
a combining unit that combines outputs of the power amplifiers in the on-controlled state to output a combined output signal;
a filter unit that filters the combined output signal for output as an amplitude modulation signal in an RF band through a signal output terminal;
a measuring unit that measures a voltage value and a current value of an output signal of one of the combining unit and the filter unit;
a calculation output unit configured as an analog circuit, that outputs a first calculated value based on the voltage value and the current value measured by the measuring unit;
a first protection unit configured as an analog circuit, that outputs, based on the first calculated value, a first control signal to place the entire amplifier unit in an off-controlled state;
a second protection unit configured as a complex circuit of an analog circuit and a digital circuit, that calculates a second calculated value calculated from the voltage value and the current value that are measured by the measuring unit, and that outputs a second control signal to control an upper limit number of the power amplifiers that can be in the on-controlled state in parallel and a third control signal to on/off control the upper limit number or less or the initial number of the power amplifiers, based on the second calculated value; and
a control unit that performs an on/off control of the power amplifiers of the power amplifier unit based on the sound signal, the first control signal, the second control signal, and the third control signal.

11. The digital amplitude modulation device according to claim 10, wherein
the second protection unit includes a rebooting unit that outputs a reboot signal to change a status of the third control signal.

12. The digital amplitude modulation device according to claim 11, wherein
the second protection unit further includes a rebooting unit that outputs a reboot signal to change a status of the first control signal.

13. The digital amplitude modulation device according to claim 11, wherein
the second protection unit includes a counter unit that counts outputs of the reboot signal and that maintains the upper limit number of the amplifiers that can be in the on-controlled state by the third control signal, or controls to reduce output power.

14. The digital amplitude modulation device according to claim 10, wherein the second control signal is output exclusively relative to the first control signal and the third control signal.

15. The digital amplitude modulation device according to claim 10, wherein
the second protection unit includes
an arithmetic unit that calculates an evaluation value based on the calculated value; and
an upper-limit control unit that outputs the second control signal based on the evaluation value.

16. The digital amplitude modulation device according to claim 15, further comprising
a storage unit that stores, in advance, an initial evaluation value that is an initial value of the evaluation value, wherein
the arithmetic unit corrects the evaluation value acquired by calculation based on the initial evaluation value, and outputs the corrected evaluation value instead of the evaluation value acquired by calculation.

17. The digital amplitude modulation device according to claim 16, wherein
a reflection coefficient is used as the evaluation value, and an impedance at a time of measurement is calculated from an impedance in an initial state stored in the storage unit, or one of an output power and a reflected power at a time of measurement is calculated based on information about an output power in an initial state stored in the storage unit.

18. The digital amplitude modulation device according to claim 15, wherein
the arithmetic unit generates at least one of an SWR, a reflection coefficient, and a reflected power as the evaluation value.

19. A digital amplitude modulation device comprising:
a power amplifier unit including a plurality of power amplifiers connected in parallel to be on/off controlled based on an input sound signal, that amplify power of an input carrier signal when the power amplifiers are an on-controlled state;
a combining unit that combines outputs of the power amplifiers in the on-controlled state to output a combined output signal;
a filter unit that filters the combined output signal for output as an amplitude modulation signal in an RF band through a signal output terminal;
a measuring unit that measures a voltage value and a voltage value that differs in phase $\pi/2$ from the voltage value of an output signal of one of the combining unit and the filter unit;
a calculation output unit configured as an analog circuit, that outputs a first calculated value based on the voltage value and the voltage value that differs in phase by $\pi/2$ from the voltage value measured by the measuring unit;
a first protection unit configured as an analog circuit, that outputs, based on the first calculated value, a first control signal to place the entire amplifier unit in an off-controlled state;
a second protection unit configured as a complex circuit of an analog circuit and a digital circuit, that calculates a second calculated value calculated from the voltage value and the voltage value that differs in phase by $\pi/2$ from the voltage value that are measured by the measuring unit, and that outputs a second control signal to control an upper limit number of the power amplifiers that can be in the on-controlled state in parallel and a third control signal to on/off control the upper limit number or less or the initial number of the power amplifiers, based on the second calculated value; and a control unit that performs an on/off control of the power amplifiers of the power amplifier unit based on the sound signal, the first control signal, the second control signal, and the third control signal.

20. The digital amplitude modulation device according to claim 19, wherein
the second protection unit includes a rebooting unit that outputs a reboot signal to change a status of the third control signal.

21. The digital amplitude modulation device according to claim 20, wherein
the second protection unit further includes a rebooting unit that outputs a reboot signal to change a status of the first control signal.

22. The digital amplitude modulation device according to claim 20, wherein
the second protection unit includes a counter unit that counts outputs of the reboot signal and that maintains the upper limit number of the amplifiers that can be in the on-controlled state by the third control signal, or controls to reduce output power.

23. The digital amplitude modulation device according to claim 19, wherein
the second control signal is output exclusively relative to the first control signal and the third control signal.

24. The digital amplitude modulation device according to claim 19, wherein
the second protection unit includes
an arithmetic unit that calculates an evaluation value based on the calculated value; and
an upper-limit control unit that outputs the second control signal based on the evaluation value.

25. The digital amplitude modulation device according to claim 24, further comprising
a storage unit that stores, in advance, an initial evaluation value that is an initial value of the evaluation value, wherein
the arithmetic unit corrects the evaluation value acquired by calculation based on the initial evaluation value, and outputs the corrected evaluation value instead of the evaluation value acquired by calculation.

26. The digital amplitude modulation device according to claim 25, wherein
a reflection coefficient is used as the evaluation value, and an impedance at a time of measurement is calculated from an impedance in an initial state stored in the storage unit, or one of an output power and a reflected power at a time of measurement is calculated based on information about an output power in an initial state stored in the storage unit.

27. The digital amplitude modulation device according to claim 24, wherein
the arithmetic unit generates at least one of an SWR, a reflection coefficient, and a reflected power as the evaluation value.

28. A digital amplitude modulation method that is performed in a digital amplitude modulation device comprising a power amplifier unit including a plurality of power amplifiers connected in parallel to be on/off controlled based on an input sound signal, that amplify power of a carrier signal input in an on-controlled state; a combining unit that combines outputs of the power amplifiers in the on-controlled state to output a combined output signal; a filter unit provided in a stage following the combining unit, that filters the combined output signal for output as an amplitude modulation signal in an RF band through a signal output terminal; and a calculation output unit configured as an analog circuit, that outputs a calculated value based on one of the combined output signal and the amplitude modulation signal, the method comprising:

a step of generating, based on the calculated value, a first control signal to place the entire amplifier unit in an off-controlled state;

a step of generating a second control signal to control an upper limit number of the amplifiers that can be in the on-controlled state in parallel based on the calculated value;

a step of generating a third control signal to on/off control the upper limit number or less or the initial number of the amplifiers, based on the calculated value; and a step of performing an on/off control of the power amplifiers based on the sound signal, the first control signal, the second control signal, and the third control signal.

* * * * *